United States Patent
Behler et al.

(10) Patent No.: US 6,585,145 B2
(45) Date of Patent: Jul. 1, 2003

(54) DIE BONDER AND/OR WIRE BONDER WITH A DEVICE FOR HOLDING DOWN A SUBSTRATE

(75) Inventors: Stefan Behler, Steinhausen (CH); Beat Zumbuehl, Rotkreuz (CH); Reto Schubiger, Ebikon (CH); Ruedi Grueter, Neuenkirch (CH); Rolf Schuermann, Singapore (CH)

(73) Assignee: ESEC Trading SA, Cham (CH)

( * ) Notice: Subject to any disclaimer, the term of this patent is extended or adjusted under 35 U.S.C. 154(b) by 0 days.

(21) Appl. No.: 10/006,201

(22) Filed: Dec. 4, 2001

(65) Prior Publication Data

US 2002/0066765 A1 Jun. 6, 2002

(30) Foreign Application Priority Data

Dec. 6, 2000 (CH) ................................ 2396/00

(51) Int. Cl.7 ............................ B25B 11/00; B23K 5/22
(52) U.S. Cl. ................ 228/4.5; 228/20.1; 228/44.3; 228/44.7; 269/21
(58) Field of Search ............ 228/4.5, 19, 20.1, 228/44.3, 44.7, 13; 269/21

(56) References Cited

U.S. PATENT DOCUMENTS

| 3,724,835 A | | 4/1973 | Gnoth | |
|---|---|---|---|---|
| 3,907,268 A | | 9/1975 | Hale | |
| 5,281,794 A | | 1/1994 | Uehara et al. | |
| 5,374,021 A | * | 12/1994 | Kleinman | 248/362 |
| 5,417,408 A | * | 5/1995 | Ueda | 269/21 |
| 5,707,051 A | * | 1/1998 | Tsuji | 269/21 |
| 5,923,408 A | * | 7/1999 | Takabayashi | 355/53 |
| 6,435,492 B1 | * | 8/2002 | Behler et al. | 269/21 |
| 6,444,492 B1 | * | 9/2002 | Ohta | 438/108 |

FOREIGN PATENT DOCUMENTS

| DE | 142 406 A | 6/1980 |
|---|---|---|
| EP | 0 433 503 A1 | 6/1991 |
| GB | 2 109 716 A | 6/1983 |
| GB | 2 291 926 A | 2/1996 |
| JP | 58-121640 | 7/1983 |
| JP | 06-306247 | 11/1994 |

\* cited by examiner

*Primary Examiner*—M. Alexandra Elve
*Assistant Examiner*—Len Tran
(74) *Attorney, Agent, or Firm*—McCormick, Paulding & Huber LLP

(57) ABSTRACT

A Die Bonder or a Wire Bonder contains a device for holding down a substrate. The device comprises a table with drill holes. The drill holes are mechanically programmable with regard to whether vacuum can be applied to them or not. The mechanical programming enables a fast and easy adaptation of the device to different substrates.

4 Claims, 2 Drawing Sheets

DIE BONDER AND/OR WIRE BONDER WITH A DEVICE FOR HOLDING DOWN A SUBSTRATE

CROSS REFERENCE TO RELATED APPLICATIONS

Figure 1:
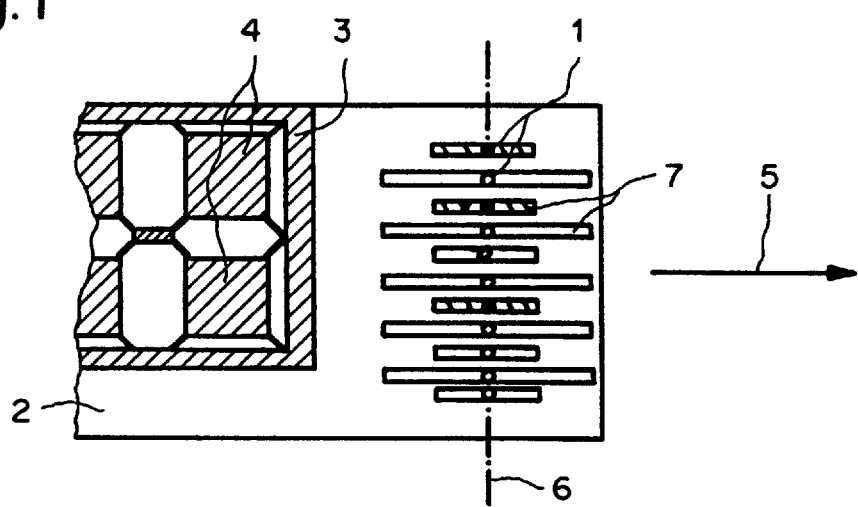

This application claims priority from and incorporates by reference the subject matter of Swiss Patent Application No. 2000 2396/00 filed Dec. 6, 2000.

The invention concerns a Die Bonder and/or Wire Bonder with a device for holding down a substrate.

BACKGROUND OF THE INVENTION

When mounting semiconductor chips onto a substrate by means of a so-called Die Bonder, the substrate is transported in cycles on a support surface by a predetermined distance in a transport direction and/or laterally to the transport direction so that a semiconductor chip can be mounted in the foreseen position. With the Die Bonders marketed by the applicant, the substrate lies on a rigidly arranged plate which has a drill hole which can be connected to a vacuum source for sucking and holding down the substrate. For the processing of so-called matrix substrates with which the chip islands for accepting the semiconductor chips are arranged in rows and columns, a downholder device with only one drill hole is hardly suitable: When mounting the semiconductor chips, one chip island after the other has to be transported to the rigidly arranged drill hole. In doing so, undesirable abrasion marks can occur on the underneath of the matrix substrate.

Die Bonders are also known with which the matrix substrate lies on a plate with several drill holes which moves together with the matrix substrate when movement of the matrix substrate at right angles to transport direction is necessary. For matrix substrates with cut-outs, with which the chip islands are separated from each other, a plate must be manufactured for each type of substrate the drill holes of which are adapted to the geometry of the chip islands.

The object of the invention is to develop a downholder device which is suitable for substrates of different types and geometry.

BRIEF DESCRIPTION OF THE INVENTION

A device in accordance with the invention has a table for holding down the substrate. The table contains a connection to which vacuum can be applied as well as drill holes which run at right angles to the transport direction of the substrate. In a mechanical way it can be programmed which of the drill holes are connected to the vacuum connection and which of the drill holes are not connected to the vacuum connection.

With a first embodiment, the drill holes open out onto a groove covered by a foil which is connected to the vacuum connection in the table. By piercing the foil by means of a point in that the point is pushed into individually selected drill holes it is possible to manually determine which of the drill holes are in contact with the groove and therefore carry vacuum when vacuum is applied to the groove. The groove is incorporated into a drawer removably arranged in the table so that the foil can be exchanged in an easy manner.

With a second embodiment, an under surface of the table has several, but at least two, cavities of differing length which are connected to the vacuum connection. The table contains a removable drawer which can be engaged in various positions. The side of the drawer facing the under surface of the table contains cavities which form channels which connect the vacuum carrying cavity in the table with individual drill holes. The number of these channels is dependent on the actual engaging position of the drawer. In position 1 of the drawer, only one channel is present, in position 2 of the drawer two channels are present, etc. In this way, by shifting the position of the drawer it is possible to change the distance between the outermost drill holes which carry vacuum.

The accompanying drawings, which are incorporated into and constitute a part of this specification, illustrate embodiments of the present invention and, together with the detailed description, serve to explain the principles and implementations of the invention. The figures are not to scale.

BRIEF DESCRIPTION OF THE DRAWING FIGURES

Figure 2:
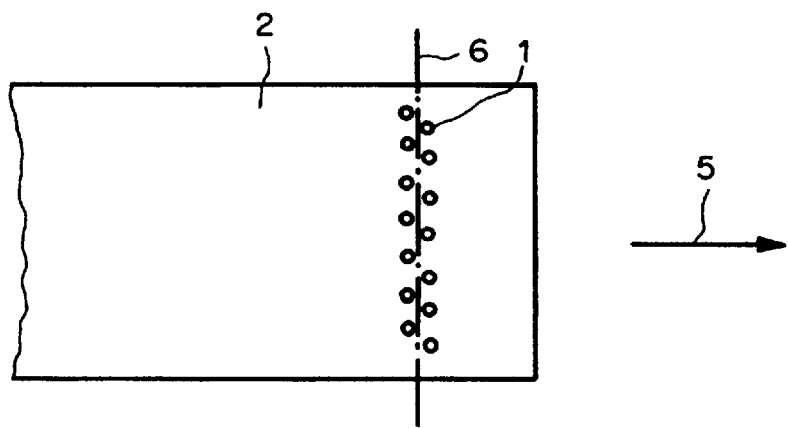
Figure 3:
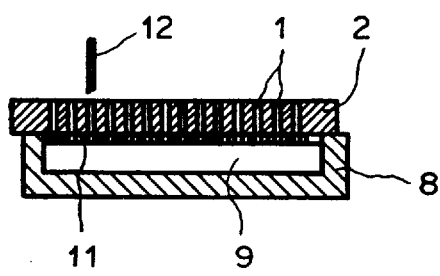
Figure 4:
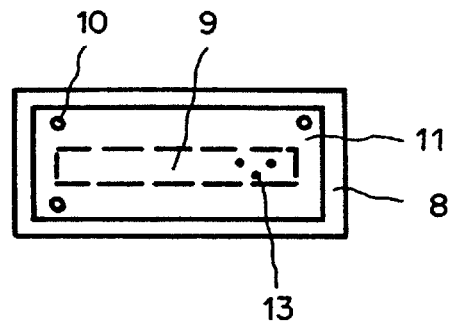
Figure 5:
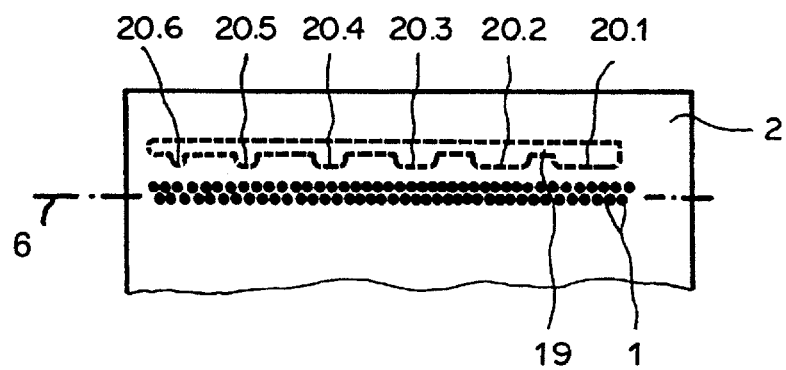
Figure 6:
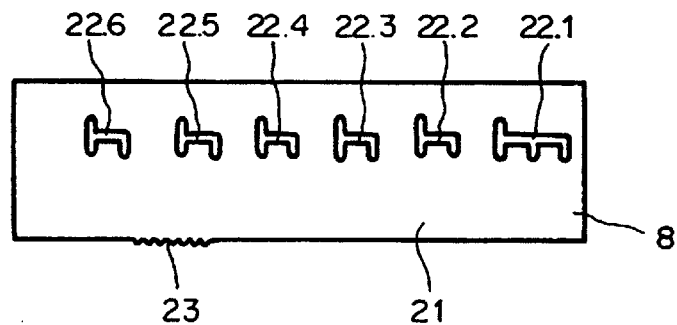

It is shown in:

FIG. 1 a table with numerous drill holes for accepting and the temporary holding of a substrate, FIG. 2 a further table, FIG. 3 a cross-section of the table in accordance with a first embodiment, FIG. 4 a drawer belonging to the table, and FIGS. 5, 6 the table and the drawer in accordance with a second embodiment.

DESCRIPTION OF THE PREFERRED EMBODIMENTS

FIG. 1 shows a plan view of a table 2 having numerous drill holes 1 for the acceptance and temporary holding of a substrate, in the present case, a matrix substrate 3 with chip islands 4 separated from each other. For reasons of illustrative clarity, the matrix substrate 3 is shown with only the chip islands 4 without further details and shifted laterally to the drill holes 1. With a Die Bonder or Wire Bonder, the table 2 is part of the downholder device for the substrate and is secured there but exchangeable. With the processing of the matrix substrate 3, the table 2 moves with it whenever advancing of the matrix substrate 3 takes place at right angles to the actual transport direction 5. The table 2 does not move with it when advancing takes place in transport direction 5. The drill holes 1 are arranged along a line 6 running at right angles to the transport direction 5.

With a first version suitable for matrix substrates with which the length of the chip islands 4 is greater than 8 mm in transport direction 5, the drill holes 1 open out in grooves 7 incorporated into the support surface of the table 2 running longitudinally to the transport direction 5. The grooves 7 can all have the same length or, as in the version presented, can have different lengths so that even chip islands 4 of differing length can be reliably held down. For the specific matrix-substrate 3 presented in FIG. 1 the drill holes 1 carrying vacuum during the bonding process are painted as black dots whereas the other drill holes 1 carrying no vacuum are drawn as open circles. Accordingly the grooves 7 carrying vacuum are presented hatched.

With a second version suitable for matrix substrates shown in FIG. 2 with which the length of the chip islands 4 is less than 8 mm in transport direction 5, the drill holes 1 are shifted diagonally on both sides of the line 6. The diameter of the drill holes 1 amounts to typically 0.8 mm. The drill holes 1 are arranged and dimensioned so that a chip island 4 with an area of only 2 mm*2 mm completely covers at least one single drill hole 1.

With both versions, the drill holes 1 are mechanically programmable. The term "mechanical programming" means that, by means of mechanical adjustments to the downholder device, it is determined at the start of a mounting process to which of the drill holes 1 on the side of the downholder device facing the support surface of the table 2 vacuum can be applied and to which no vacuum can be applied. The way in which this mechanical programming takes place is now explained in more detail based on the following examples.

EXAMPLE 1

FIG. 3 shows a cross-section of the downholder device along the line 6 of FIG. 1. The table 2 has a removable drawer 8 incorporated into the bottom of which is a groove 9 which in operation is connected to the vacuum source. In addition, the bottom of the drawer 8 has three projecting cams 10 (FIG. 4). A foil 11 is inserted into the drawer 8 whereby the cams 10 engage into corresponding holes which are made in the foil 11. For the foil, preferably a hard PVC foil is used as is marketed, for example, by the company Vink AG under the trade name of VIKUNYL. The drill holes 1 of the table 2 open out on the foil 11 in the area of the groove 9. When retooling the Die Bonder for a new type of substrate, the drawer 8 is pulled out, the foil 11 inserted into the drawer 8 is replaced by a new foil 11 greased with vacuum grease and the drawer 8 pushed back into the table 2. If, in this condition, vacuum is applied to the groove 9, then the foil 11 prevents the drill holes 1 from carrying vacuum. Those drill holes 1 which must carry vacuum are therefore mechanically programmed in that a needle 12 is introduced manually which pierces the foil 11. The needle 12 does not have a conventional conical tip but has a one-sided sloping tip which guarantees that the pierced foil 11 does not close again. If, in this condition, vacuum is applied to the groove 9, then the drill holes 1 which have been pierced with the needle 12 carry vacuum.

FIG. 4 shows a plan view of the drawer 8 and the inserted foil 11 with some of the holes 13 pierced by the needle. The groove 9 covered by the foil 11 is drawn with a broken line.

EXAMPLE 2

This example, explained with reference to FIGS. 5 and 6 is not suitable for matrix substrates but for substrates without cut-outs, for example BGA® substrates. The table 2 shown from above in FIG. 5 has on the under surface a number of at least two cavities of different lengths 20.1 to 20.6 which are connected to a continuous groove 19. In the example, the number of cavities 20.1 to 20.6 amounts to six. As with the first example, a drawer 8 is present. The drawer 8 presented in FIG. 6 has a surface 21 with six cavities 22.1 to 22.6. The cavities 22.1 to 22.6 have a lateral arm facing the groove 19 and two or three lateral arms facing the drill holes 1. Before inserting, vacuum grease is applied to this surface 21. The surface 21 of the drawer 8 rests on the under surface of the table 2 whereby the groove 19 forms a channel to which vacuum can be applied. The vacuum grease ensures that the channel and the cavities 20.1 to 20.6 as well as the cavities 22.1 to 22.6 are sealed airtight towards the outside.

The drawer 8 can engage in six different positions 1 to 6 in the table 2 for which purpose engaging indentations 23 are foreseen on the drawer 8 for engaging in the table 2. In position 1, a lateral arm of the cavity 22.1 of the drawer 8 overlaps the cavity 20.1 of the table 2. However, in position 1 the lateral arms of the other five cavities 22.2 to 22.6 of the drawer 8 overlap none of the cavities 20.1 to 20.6 of the table 2. Cavity 22.1 has three further lateral arms which overlap three drill holes 1 so that in position 1 of the drawer 8 these three drill holes 1 carry vacuum while all other drill holes 1 carry no vacuum. In position 2, the one lateral arm of cavity 22.1 continues to overlap cavity 20.1. In addition, one lateral arm of the cavity 22.2 of the drawer 8 overlaps the cavity 20.2 of the table 2. Because cavity 22.2 has two arms facing the drill holes 1 (FIG. 5), in position 2 of the drawer 8, already five drill holes 1 carry vacuum while the remaining drill holes 1 carry no vacuum. In position 3 of the drawer 8, three cavities of the drawer 8 and the table 2 overlap, in position 4 four cavities, in position 5 five cavities and in position 6 six cavities so that the number of drill holes 1 carrying vacuum continuously increases with increasing position number. The peculiarity of the construction lies in that the movement path of the drawer 8 from position 1 to position 6 amounts to only 7.5 mm while the distance between the two outermost drill holes 1 which carry vacuum increases from 10 mm to 65 mm. In this way, the area of the drill holes 1 carrying vacuum can be quickly and easily adapted to substrates of differing width.

It is advantageous when the drawer 8 is formed so that, by turning through 180°, it can be used on one side in accordance with example 1 and, on the other side, can be used in accordance with example 2.

While embodiments and applications of this invention have been shown and described, it would be apparent to those skilled in the art having the benefit of this disclosure that many more modifications than mentioned above are possible without departing from the inventive concepts herein.

What is claimed is:

1. Die Bonder and/or Wire Bonder with a device for holding down a substrate comprising a table with drill holes to which vacuum can be applied, an under surface of the table having at least two cavities of different lengths to which vacuum can be applied, and a removable drawer, the surface of which faces the under surface of the table having cavities, whereby the cavities in the drawer comprise a lateral arm facing the cavities of the table and at least one lateral arm facing the drill holes, wherein the drawer can be engaged in different positions in the table whereby in the different positions of the drawer a different number of the cavities of the drawer and of the cavities of the table overlap.

2. Die Bonder and/or Wire Bonder according to claim 1, wherein the at least two cavities in the under surface of the table are connected by means of a groove.

3. Die Bonder and/or Wire Bonder according to claim 1, wherein another side of the drawer has a groove which can be covered by a foil and to which vacuum can be applied, and wherein the drawer can be inserted into the table in an inverted position in which the foil rests on the under surface of the table.

4. Die Bonder and/or Wire Bonder according to claim 2, wherein another side of the drawer has a groove which can be covered by a foil and to which vacuum can be applied, and wherein the drawer can be inserted into the table in an inverted position in which the foil rests on the under surface of the table.

* * * * *

UNITED STATES PATENT AND TRADEMARK OFFICE
CERTIFICATE OF CORRECTION

PATENT NO. : 6,585,145 B2
DATED : July 1, 2003
INVENTOR(S) : Stefan Behler et al.

It is certified that error appears in the above-identified patent and that said Letters Patent is hereby corrected as shown below:

Column 1,
Lines 63 and 67, delete "under surface" and insert in its place -- undersurface --

Column 3,
Lines 45 and 55, delete "under surface" and insert in its place -- undersurface --

Signed and Sealed this

Twenty-third Day of December, 2003

JAMES E. ROGAN
*Director of the United States Patent and Trademark Office*

UNITED STATES PATENT AND TRADEMARK OFFICE
CERTIFICATE OF CORRECTION

PATENT NO. : 6,585,145 B2
DATED : July 1, 2003
INVENTOR(S) : Stefan Behler et al.

It is certified that error appears in the above-identified patent and that said Letters Patent is hereby corrected as shown below:

<u>Column 4,</u>
Lines 36-62, claims 1-4 should read:

-- 1. Die Bonder and/or Wire Bonder with a device for holding down a substrate comprising a table with drill holes to which vacuum can be applied, an [under surface] --undersurface-- of the table having at least two --first-- cavities of different lengths to which vacuum can be applied, and a removable drawer, [the] --one-- surface of [which faces] --the drawer facing-- the [under surface] --undersurface-- of the table --and-- having --second-- cavities, whereby the --second-- cavities in the drawer comprise a lateral arm facing the --first-- cavities of the table and at least one lateral arm facing the drill holes, wherein the drawer can be engaged in different positions in the table whereby in the different positions of the drawer [a] different number --s-- of the second cavities of the drawer and [of] the first cavities of the table overlap.

2. Die Bonder and/or Wire Bonder according to claim 1, wherein the at least two -- first-- cavities in the [under surface] --undersurface-- of the table are connected by means of a groove.

3. Die Bonder and/or Wire Bonder according to claim 1, wherein another side of the drawer has a groove which can be covered by a foil and to which vacuum can be applied, and wherein the drawer can be inserted into the table in an inverted position in which the foil rests on the [under surface] --undersurface-- of the table.

4. Die Bonder and/or Wire Bonder according to claim 2, wherein another side of the drawer has a groove which can be covered by a foil and to which vacuum can be applied, and wherein the drawer can be inserted into the table in an inverted position in which the foil rests on the [under surface] --undersurface-- of the table. --

Signed and Sealed this

Thirteenth Day of April, 2004

JON W. DUDAS
*Acting Director of the United States Patent and Trademark Office*